United States Patent [19]

Okamoto

[11] Patent Number: 5,070,306
[45] Date of Patent: Dec. 3, 1991

[54] HIGH-GAIN DIFFERENCIAL AMPLIFIER CIRCUIT FABRICATED FROM FIELD EFFECT TRANSISTORS

[75] Inventor: Toshiyuki Okamoto, Tokyo, Japan

[73] Assignee: NEC Corporation, Japan

[21] Appl. No.: 672,346

[22] Filed: Mar. 20, 1991

[30] Foreign Application Priority Data

Mar. 26, 1990 [JP] Japan .................................. 2-77674

[51] Int. Cl.⁵ .............................................. H03F 3/45
[52] U.S. Cl. .................................. 330/253; 330/257; 330/277
[58] Field of Search ................ 330/253, 257, 261, 277

[56] References Cited

U.S. PATENT DOCUMENTS

| | | | |
|---|---|---|---|
| 4,766,394 | 8/1988 | Yukawa | 330/253 |
| 4,801,891 | 1/1989 | Novosel et al. | 330/253 |
| 4,893,090 | 1/1990 | Boudewijns | 330/257 |
| 4,904,953 | 2/1990 | McCormack | 330/253 |
| 5,021,745 | 6/1991 | Kondou et al. | 330/253 |

FOREIGN PATENT DOCUMENTS 57-203305 12/1982 Japan .................................. 330/257
58-70609 4/1983 Japan .................................. 330/257

Primary Examiner—Eugene R. LaRoche
Assistant Examiner—Tan Dinh
Attorney, Agent, or Firm—Laff, Whitesel, Conte & Saret

[57] ABSTRACT

A differential amplifier circuit comprises a series combination of a p-channel type first input transistor and an n-channel type first load transistor coupled between a first constant current source and a discharging line, a series combination of a p-channel type second input transistor and an n-channel type second load transistor coupled between the first constant current source and the discharging line, and a controlling circuit coupled to gate electrodes of the first and second load transistors, and the controlling circuit increases the channel conductance of one of the first and second load transistors when the associated first or second input transistor decreases current passing therethrough in response to a non-inverted or inverted input signal, thereby improving the gain of the differential amplifier circuit.

4 Claims, 3 Drawing Sheets

HIGH-GAIN DIFFERENCIAL AMPLIFIER CIRCUIT FABRICATED FROM FIELD EFFECT TRANSISTORS

FIELD OF THE INVENTION

This invention relates to a differential amplifier circuit fabricated from field effect transistors and, more particularly, to a high-gain differential amplifier circuit incorporated in, for example, an operational amplifier unit.

DESCRIPTION OF THE RELATED ART

An operational amplifier circuit is incorporated in a large scale integration fabricated on a single semiconductor chip, and such an internal operational amplifier circuit is implemented in MOS technology.

A typical example of the MOS implementation is illustrated in FIG. 1. The circuit shown in FIG. 1 achieves a differential amplification, and another amplification stage may be coupled to the differential amplification stage. The differential amplification stage is coupled between power supply lines 10 and 20 and comprises a constant current source 1 connected to the power supply line 10, input transistors Qp1 and Qp2 coupled in parallel to the constant current source 1, and load transistors Qn3 and Qn4 respectively coupled between the input transistors Qp1 and Qp2 and the lower voltage power supply line 20. The input transistors Qp1 and Qp2 are formed by p-channel field effect transistors, and n-channel type field effect transistors respectively serve as the load transistors Qn3 and Qn4.

A non-inverting input terminal IN1 and an inverting input terminal IN2 are connected to the respective gate electrodes of the input transistors Qp1 and Qp2, and the input transistors Qp1 and Qp2 change the respective channel conductances depending upon input signals supplied to the non-inverting input terminal IN1 and the inverting input terminal IN2. Since the gate electrodes of the load transistors Qn3 and Qn4 are coupled to the drain nodes of the input transistors Qp1 and Qp2, each of the load transistors Qn3 and Qn4 increases the amount of current passing therethrough with the voltage level at the drain node of the associated input transistor Qp1 or Qp2 so as to follow up the variation of the channel conductance of the associated input transistor.

The constant current I1 from the source 1 is split into two branch currents, and the amounts of the two branch currents depend on the voltage levels at the non-inverting and inverting input terminals IN1 and IN2. The gain G1 of the differential amplification stage is roughly given by Equation 1.

$$G1 = gm1 / gm3 \quad \text{....... Equation 1}$$

where gm1 is the transconductance of the input transistor Qp1 and gm3 is the transconductance of the load transistor Qn3 The transconductance gm1 is of the order of $1.0 \times x\, 10^{-3}$, and the transconductance gm3 is about $1.0 \times 10^{-4}$ Therefore, the gain G1 of the prior art differential amplification stage is about 20 dB.

Another differential amplification stage shown in FIG. 2 has been proposed for improving the current gain. The differential amplification stage shown in FIG. 2 is also coupled between power supply lines 30 and 40, and comprises a constant current source 3 connected to the power supply line 30, two input transistors Qp5 and Qp6 and two load transistors Qn7 and Qn8. The input transistors Qp5 and Qp6 are of the p-channel field effect transistor, and the load transistors Qn7 and Qn8 are implemented by n-channel field effect transistors. The input transistors Qp5 and Qp6 are supplied with input signals through a non-inverting input terminal IN3 and an inverting input terminal IN4, respectively, and the gate electrodes of the load transistors Qn7 and Qn8 are biased with a reference voltage node RF1. The reference voltage node RF1 produces a constant reference voltage at all times. The gain G2 of the differential amplification stage shown in FIG. 2 is roughly given by Equation 2.

$$G2 = gm5 \times rd7 \quad \text{.....} \qquad \text{Equation 2}$$

where gm5 is the transconductance of the input transistor Qp5 and rd7 is the resistance produced at the drain node of the load transistor Qn7. The resistance rd7 is a kind of the output impedane in terms of the input transistor Qp5. The transconductance gm5 is as large as the transconductance gm1, and the resistance rd7 is of the order of $1.0 \times 10^5$ ohms Therefore, the gain G2 is increased to about 40 dB.

Thus, the differential amplifier shown in FIG. 2 is slightly increased in gain, however, a large scale integrated circuit needs an advanced differential amplifier circuit which achieves a larger gain.

SUMMARY OF THE INVENTION

It is therefore a major object of the present invention to provide a differential amplifier circuit which achieves an improved gain.

To accomplish the object, the present invention proposes a measurement for increasing the channel conductance of a load transistor while current at the drain node thereof is decreased.

In accordance with the present invention, there is provided a differential amplifier circuit coupled between first and second power supply lines, comprising: a) a first constant current source coupled to the first power supply line; b) a series combination of a first input transistor of a first channel conductivity type and a first load transistor of a second channel conductivity type coupled between the first constant current source and the second power supply line, the first input transistor having a gate electrode serving as a non-inverting input node; c) a series combination of a second input transistor of the first channel conductivity type and a second load transistor of the second channel conductivity type coupled between the first constant current source and the second power supply line, the second input transistor having a gate electrode serving as an inverting input node; and d) a controlling circuit coupled to gate electrodes of the first and second load transistors and operative to increase the channel conductance of one of the first and second load transistors when the associated first or second input transistor decreases current passing therethrough, the controlling circuit being further operative to decrease the channel conductance of the other of the first and second load transistors when the associated first or second input transistor increases current passing therethrough.

BRIEF DESCRIPTION OF THE DRAWINGS

The features and advantages of the differential amplifier circuit according to the present invention will be more clearly understood from the following description taken in conjunction with the accompanying drawings in which.

DESCRIPTION OF THE PREFERRED EMBODIMENT

Figure 1:
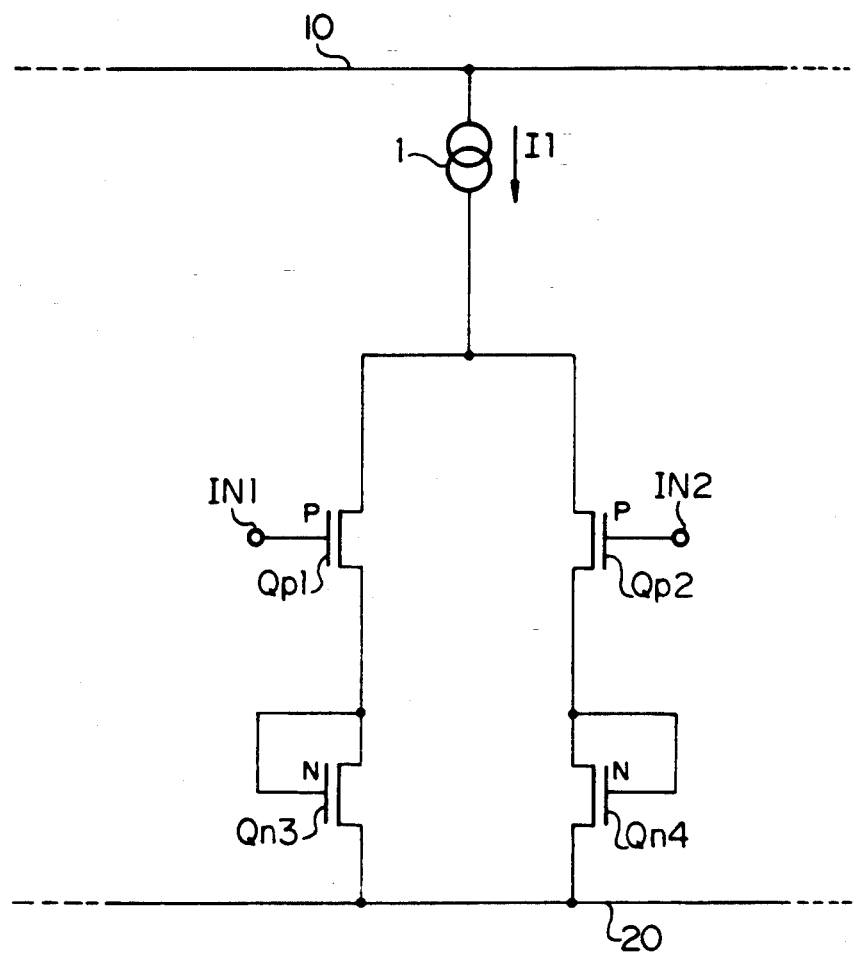
FIG. 1 is a circuit diagram showing the circuit arrangement of a prior art differential amplification stage incorporated in an operational amplifier unit.
Figure 2:
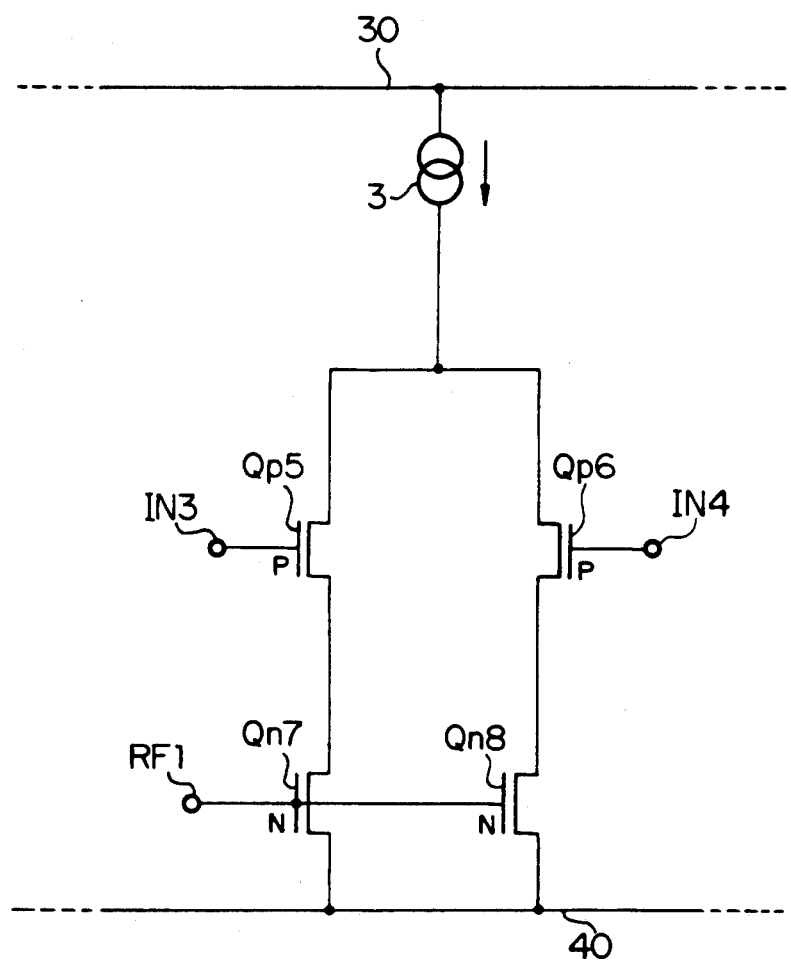
FIG. 2 is a circuit diagram showing the circuit arrangement of another prior art differential amplification stage which achieves a higher current gain than that shown in FIG. 1.
Figure 3:
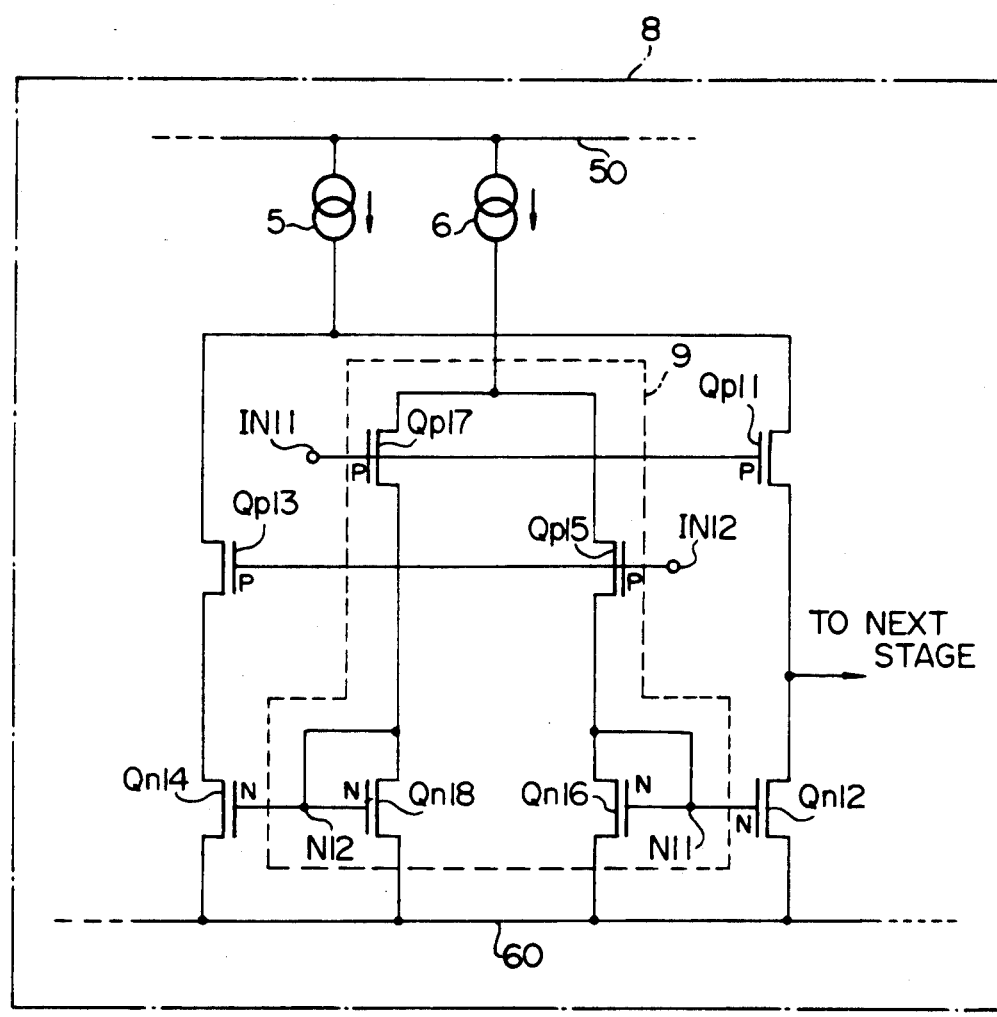
FIG. 3 is a circuit diagram showing the circuit arrangement of a differential amplifier circuit according to the present invention.

Referring to FIG. 3, a differential amplifier circuit embodying the present invention is coupled between power supply lines 50 and 60 to one of which first and second constant current sources 5 and 6 are connected. The current fed from each constant current source 5 or 6 is split into two branch currents, but the total amount of branch currents is constant at all times. The differential amplifier circuit 8 serves as a first stage of an operational amplifier unit and coupled to the next amplification stage (not shown). The operational amplifier unit forms a part of a large scale integrated circuit fabricated on a single semiconductor chip. The differential amplifier circuit 8 according to the present invention is provided with a controlling circuit 9, and the controlling circuit 9 is coupled between the second constant current source 6 and the power supplyline 60.

The differential amplifier circuit 8 comprises a series combination of a first input transistor Qp11 and a first load transistor Qn12 coupled in series between the first constant current source 5 and the power supply line 60, and a series combination of a second input transistor Qp13 and a second load transistor Qn14 coupled in series between the first constant current source 5 and the discharging line 7. The first and second input transistors Qp11 and Qp13 are of the p-channel type, and the first and second load transistors Qn12 and Qn14 are implemented by n-channel field effect transistors. The first input transistor Qp11 has a gate electrode serving as a non-inverting in putnode IN11, and the gate electrode of the first load transistor Qn12 is coupled to a first output node N11 of the controlling circuit 9 On the other hand, the gate electrode of the second input transistor Qp13 provides an inverted node IN12, and a second output node N12 of the controlling circuit 9 is coupled to the gate electrode of the second load transistor Qp14. The common drain node of the transistors Qp11 and Qn12 is coupled to the next amplification stage (not shown).

The controlling circuit 9 comprises a series combination of a third input transistor Qp15 and a third load transistor Qn16 coupled between the second constant current source 6 and the power supply line 60, and a series combination of a fourth input transistor Qp17 and a fourth load transistor Qn18 also coupled between the second constant current source 6 and the power supply line 60. The third and fourth input transistors Qp15 and Qp17 are of the p-channel type, and the third and fourth load transistors Qn16 and Qn18 are formed by n-channel type field effect transistors, respectively. The gate electrode of the third input transistor Qp15 is coupled to the inverting input node IN12, and, accordingly, the second and third input transistors Qp13 and Qp15 concurrently turn on and off. Similarly, the fourth input transistor Qp17 is coupled to the non-inverting input node so that first and fourth input transistors Qp11 and Qp17 concurrently increase or decrease the channel conductances thereof. A gate electrode of the third load transistor Qn16 serves as the first output node N11, and the gate electrode or the first output node N11 is coupled to not only the drain node thereof but also the gate electrode of the first load transistor Qn12. Since the channel conductances of the first and third load transistors Qn12 and Qn16 are increased with the increased voltage level at the drain node thereof, the voltage level at the inverting node IN12 indirectly controls the channel conductance of the third load transistor Qn16 as well as the channel conductance of the first load transistor Qn12. Similarly, the gate electrode of the fourth load transistor Qn18 provides the second output node N12 and is coupled to the drain node thereof and the gate electrode of the second load transistor Qn14. The channel conductance of the second load transistor Qn14 is dependent on the voltage level at the drain node of the fourth load transistor Qn18 which is varied by the second input transistor Qp13.

Description is made on the circuit behavior of the differential amplifier circuit according to the present invention. Assuming now that the non-inverting input node IN11 becomes higher in voltage level than the inverting input node IN12, the first and fourth input transistors Qp11 and Qp17 decrease the channel conductances, and the amount of the branch current passing through each input transistor Qp11 or Qp17 is decreased. However, the decrement of the branch current is taken up by each of the second and third input transistors Qp13 and Qp15, and the amount of branch current passing through each second or third input transistor Qp13 or Qp15 is increased. The branch current thus increased by the third input transistor Qp17 causes the voltage level at the drain node of the third load transistor Qn16 to go up, and the higher voltage level increases the channel conductance of the third load transistor Qn16 and, accordingly, the channel conductance of the first load transistor Qn12. The voltage level at the drain node of the first input transistor Qp11 is further lowered and decreases the amount of current supplied to the next stage and the voltage level at the input node of the next amplification stage. This results in a large variation of current and voltage level.

If the voltage level at the non-inverting input node IN11 is lowered with respect to the voltage level at the inverting input node IN12, the amount of the branch current passing through each input transistor Qp11 or Qp17 is increased, and, accordingly, the second and third input transistors Qp13 and Qp15 decrease the branch currents passing therethrough. The branch current thus decreased causes the voltage level at the drain node of the third input transistor Qp15 to go down, and the channel conductance of the third load transistor Qn16 and, accordingly, the channel conductance of the first load transistor Qn12 are decreased with voltage level at the drain node of the third input transistor Qp15. This results in that the amount of the branch current supplied to the next stage is further increased, and the variation of the current becomes larger than that of the prior art amplification stage.

The gain G3 of the differential amplifier circuit according to the present invention is roughly given by Equation 3

$$G3 = 2 \times gm17 \times rd13 \quad \text{..... Equation 3}$$

where gm17 is the transconductance of the fourth input transistor Qp17 and rd13 is the resistance at the drain node of the second load transistor Qp14 or the output impedance in terms of the second input transistor Qp13. In this instance, t transconductance gm17 is of the order of $1.0 \times 10^{-3}$, and the resistance rd13 is about $1.0 \times 10^5$ ohms. Equation 3 gives us the gain of about 46 dB.

As will be understood from the foregoing description, the differential amplifier circuit according to the present invention improves the gain by virtue of the controlling circuit 9 associated with the load transistors Qn12 and Qn14.

Although particular embodiments of the present invention have been shown and described, it will be obvious to those skilled in the art that various changes and modifications may be made without departing from the spirit and scope of the present invention. For example, the input transistors may be of the n-channel type and the load transistors may be of the p-channel type.

What is claimed is:

1. A differential amplifier circuit coupled between first and second power supply lines, comprising:

a) a first constant current source coupled to said first power supply line;

b) a series combination of a first input transistor of a first channel conductivity type and a first load transistor of a second channel conductivity type coupled between said first constant current source and said second power supply line, said first input transistor having a gate electrode serving as a non-inverting input node;

c) a series combination of a second input transistor of said first channel conductivity type and a second load transistor of said second channel conductivity type coupled between said first constant current source and said second power supply line, said second input transistor having a gate electrode serving as an inverting input node; and d) a controlling circuit coupled to gate electrodes of said first and second load transistors and operative to increase the channel conductance of one of said first and second load transistors when the associated first or second input transistor decreases current passing therethrough, said controlling circuit being further operative to decrease the channel conductance of the other of said first and second load transistors when the associated first or second input transistor increases current passing therethrough.

2. A differential amplifier circuit as set forth in claim 1, in which said controlling circuit comprises a series combination of a third input transistor of said first channel conductivity type and a third load transistor of said second channel conductivity type coupled between a second constant current source and said second power supply line, and a series combination of a fourth input transistor of said first channel conductivity type and a fourth load transistor of said second channel conductivity type coupled between said second constant current source and said second power supply line, said third input transistor having a gate electrode coupled to said inverting input node, said third load transistor having a gate electrode coupled to the drain node thereof and to said gate electrode of said first load transistor, said fourth input transistor having a gate electrode coupled to said non-inverting input node, said fourth load transistor having a gate electrode coupled to the drain node thereof and to said gate electrode of said second load transistor.

3. A differential amplifier circuit as set forth in claim 2, in which said first channel conductivity type and said second channel conductivity type are indicative of a p-channel type and an n-channel type, respectively.

4. A differential amplifier circuit as set forth in claim 2, in which said differential amplifier circuit is incorporated in an operational amplifier unit.

* * * * *